(12) United States Patent
Youn et al.

(10) Patent No.: US 6,218,229 B1
(45) Date of Patent: Apr. 17, 2001

(54) METHOD OF FABRICATING SEMICONDUCTOR DEVICE HAVING A DUAL-GATE

(75) Inventors: Kang-Sik Youn; Hong-Bae Park, both of Cheongju; Jong-Chae Kim, Kyeonggi-Do, all of (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 08/962,240

(22) Filed: Oct. 31, 1997

(30) Foreign Application Priority Data

Dec. 26, 1996 (KR) .................................................. 96-72489

(51) Int. Cl.[7] .............................................. H01L 21/8238
(52) U.S. Cl. ........................................... 438/231; 438/532
(58) Field of Search .................................... 438/229, 230, 438/231, 232, 279, 283, 532

(56) References Cited

U.S. PATENT DOCUMENTS

| | | | |
|---|---|---|---|
| 4,764,477 | * | 8/1988 | Chang et al. ........................ 438/231 |
| 5,030,582 | * | 7/1991 | Miyajima et al. ................... 438/231 |
| 5,036,019 | * | 7/1991 | Yamane et al. ..................... 438/231 |
| 5,134,085 | * | 7/1992 | Gilgen et al. ........................ 438/231 |
| 5,736,440 | * | 4/1998 | Manning .............................. 438/231 |

OTHER PUBLICATIONS

Rodder, et al., "A Scaled 1.8V, 0.18 $\mu$m Gate Length CMOS Technology: Device Design and Reliability Considerations," IEEE (1995) pp. 415–418.*

* cited by examiner

*Primary Examiner*—Chandra Chaudhari

(57) ABSTRACT

The method of fabricating a semiconductor device having a dual-gate provides a semiconductor substrate with a gate insulating film formed on a first portion and a second portion thereof and a polysilicon layer formed on the gate insulating film. A first dopant of a first conductive type is implanted in the polysilicon layer covering the first portion, and a second dopant of a second conductive type is implanted in the polysilicon layer covering the second portion. Then, the polysilicon layer covering the first portion is selectively etched using a first mask to form a first gate, and a third dopant of the first conductive type is implanted to form source/drain LDD regions on both sides of the first gate. Thereafter, the polysilicon layer covering the second portion is selectively etched using a second mask to form a second gate, and a fourth dopant of the second conductive type is implanted to form source/drain LDD regions on both sides of the second gate.

14 Claims, 6 Drawing Sheets

METHOD OF FABRICATING SEMICONDUCTOR DEVICE HAVING A DUAL-GATE

BACKGROUND OF THE INVENTION

1. Field of the Invention

The present invention relates to a method of fabricating a semiconductor device and, more particularly, to a method of fabricating a semiconductor device having a dual-gate.

2. Discussion of Related Art

In general, there are two methods for fabricating a semiconductor device having a dual-gate. The first method is where a dopant implantation for forming gates proceeds simultaneously with a dopant implantation for forming source/drain regions. The second method is where those dopant implantation processes are performed separately.

FIGS. 1A to 1E are cross-sectional views of a portion of a semiconductor device illustrating a process sequence for fabricating the semiconductor device having a dual-gate according to the first method.

Figure 1A:
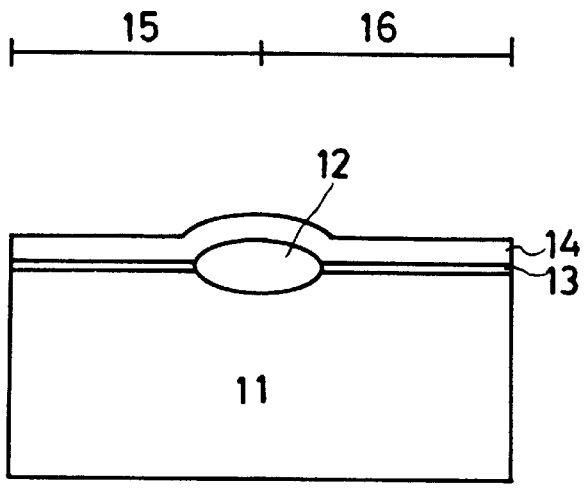

In the first method, as illustrated in FIG. 1A, a field oxide film 12 is formed on a silicon substrate 11 using the local oxidation of silicon (LOCOS) technique. Subsequently, a gate insulating film 13 is also formed on the silicon substrate 11. Then, a polysilicon layer 14 is deposited on the field oxide film 12 and the gate insulating film 13. A portion 15 on the left side of the field oxide film 12 is for forming an NMOS transistor while a portion 16 on the right side of the field oxide film 12 is for forming a PMOS transistor.

Figure 1B:
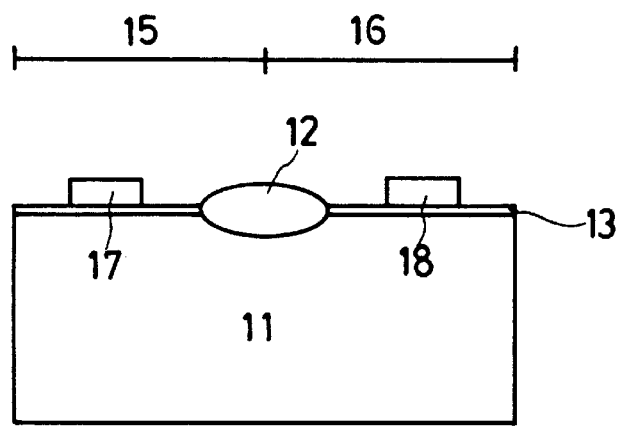

Thereafter, as illustrated in FIG. 1B, the polysilicon layer 14 is selectively etched to form an NMOS transistor gate 17 and a PMOS transistor gate 18.

Figure 1C:
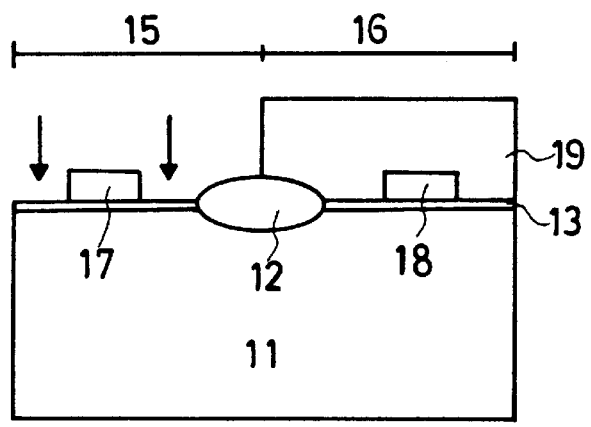

Subsequently, as illustrated in FIG. 1C, the right side portion 16 for forming the PMOS transistor is capped with a first photoresist mask 19, and then $As^+$ (Arsenic) for forming the source/drain lightly doped drain LDD regions is implanted in the left side portion 15.

Figure 1D:
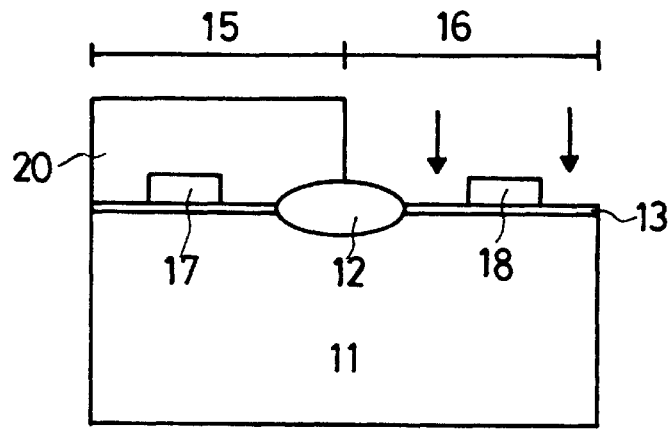

Then, as illustrated in FIG. 1D, the first mask 19 is removed. At this time, the left side portion 15 is capped with a second mask 20 of photoresist, and then $BF_2^+$ for forming the source/drain LDD regions is implanted in the right side portion 16.

Figure 1E:
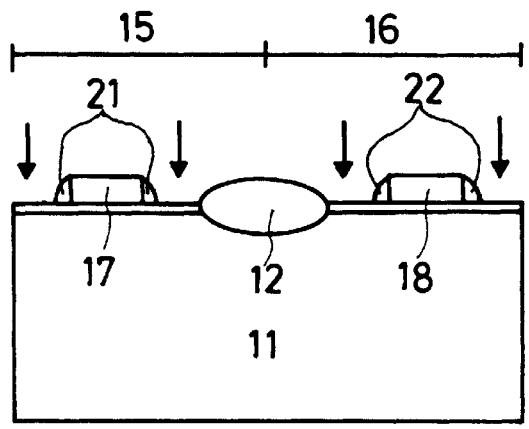

Thereafter, as illustrated in FIG. 1E, the second mask 20 is removed. At that time, side wall spacers 21 and 22 are formed on both sides of the NMOS transistor gate 17 and the PMOS transistor gate 18, respectively. Subsequently, dopant ions for forming the source/drain regions as well as the gates 17 and 18 are implanted. That is, $As^+$ (Arsenic) is implanted in the left side portion 15, and, in succession, $BF_2^+$ is implanted in the right side portion 16.

As described above, in the first semiconductor device fabrication method, the dopant implantation for forming the gates proceeds simultaneously with the dopant implantation for forming the source/drain regions. However, since $As^+$ (Arsenic) and $BF_2^+$ are implanted in the NMOS and PMOS transistors, respectively, the threshold voltage Vth varies so that proper device formation is nearly impossible. That is, a dopant, $As^+$ (Arsenic) is proper for the NMOS transistor gate while $BF_2^+$ is proper for the PMOS transistor gate. But, when $As^+$, (Arsenic) which hardly diffuses, is used as the dopant, the transistor is not sufficiently doped. Furthermore, when $BF_2^+$ is used as the dopant, the dopant ions diffuse toward the channel. As a result, the threshold voltage seriously varies.

FIGS. 2A to 2D are cross-sectional views of a portion of a semiconductor device illustrating a process sequence for fabricating the semiconductor device having a dual-gate according to the second method.

Figure 2A:
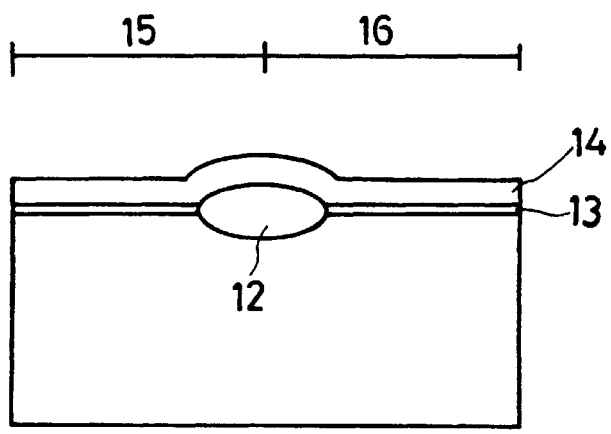

In the second semiconductor device fabrication method, as illustrated in FIG. 2A, a field oxide film 12 is formed on a silicon substrate 11 using the LOCOS technique. Subsequently, a gate insulating film 13 is formed on the silicon substrate 11. Then, a polysilicon layer 14 is deposited on the field oxide film 12 and the gate insulating film 13. Like the first method, a portion 15 on the left side of the field oxide film 12 is for forming an NMOS transistor while a portion 16 on the right side of the field oxide film 12 is for forming a PMOS transistor.

Figure 2B:
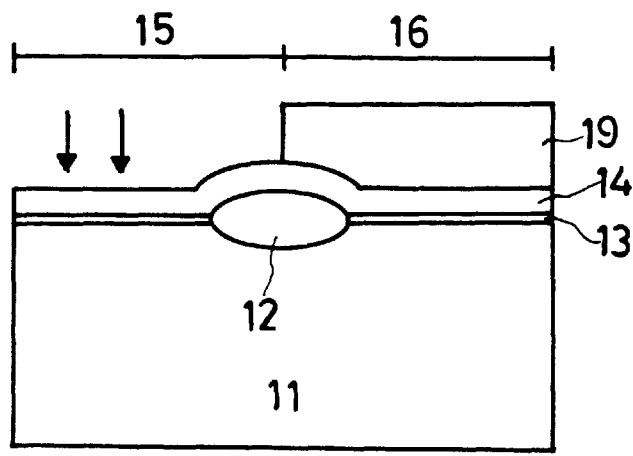

Subsequently, as illustrated in FIG. 2B, the right side portion 16 is capped with a first photoresist mask 19, and then $P^+$ (Phosphorous) is implanted in the left side portion 15.

Figure 2C:
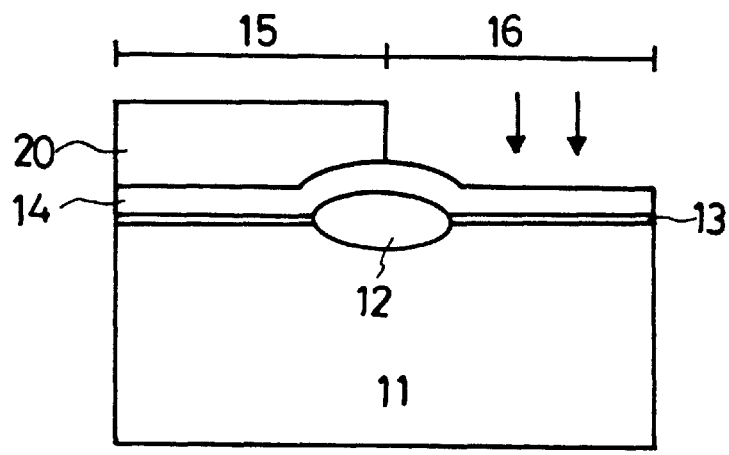

Then, as illustrated in FIG. 2C, the first mask 19 is removed. At this time, the left side portion 15 transistor is capped with a second mask 20 of photoresist, and then $B^+$ (Boron) is implanted in the right side portion 16.

Figure 2D:
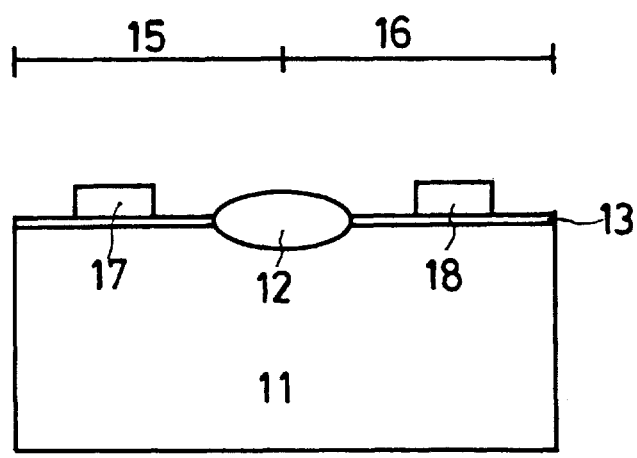

Thereafter, as illustrated in FIG. 2D, the second mask 20 is removed. At that time, the polysilicon layer 14 is selectively etched to form an NMOS transistor gate 17 and a PMOS transistor gate 18.

Then, the source/drain LDD regions are formed by the general dual-gate formation method.

As described above, in the second semiconductor device fabrication method, when the polysilicon layer 14 for forming the gates is etched, two separate types (N and P types) of ions are implanted in the left side portion 15 and the right side portion 16, respectively. As a result, the surface of the silicon substrate is damaged due to the different etching rates for each side portion.

SUMMARY OF THE INVENTION

Accordingly, the present invention is directed to a method of fabricating a semiconductor device which substantially obviates one or more of the problems due to limitations and disadvantages of the related art.

An object of the present invention is to provide a method of fabricating a semiconductor device having a stable dual-gate.

These and other objects are achieved by (a) providing a semiconductor substrate with a gate insulating film formed on a first portion and a second portion of the semiconductor substrate and a polysilicon layer formed on the gate insulating film, a first dopant of a first conductive type being implanted in the polysilicon layer covering the first portion and a second dopant of a second conductive type being implanted in the polysilicon layer covering the second portion; (b) selectively etching the polysilicon layer covering the first portion using a first mask to form a first gate; (c) selectively implanting a third dopant of the first conductive type to form source/drain LDD regions on both sides of the first gate; (d) selectively etching the polysilicon layer covering the second portion using a second mask to form a second gate; and (e) selectively implanting a fourth dopant of the second conductive type to form source/drain LDD regions on both sides of the second gate.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 1A to 1E are cross-sectional views of a portion of a semiconductor device illustrating a process sequence for fabricating the semiconductor device having a dual-gate according to a first conventional method;

FIGS. 2A to 2D are cross-sectional views of a portion of a semiconductor device illustrating a process sequence for fabricating the semiconductor device having a dual-gate according to a second conventional method; and FIGS. 3A to 3H are cross-sectional views of a portion of a semiconductor device illustrating a process sequence for fabricating the semiconductor device having a dual-gate according to a preferred embodiment of the present invention.

DETAILED DESCRIPTION OF PREFERRED EMBODIMENT

Reference will now be made in detail to the preferred embodiments of the present invention, examples of which are illustrated in the accompanying drawings.

Figure 3A:
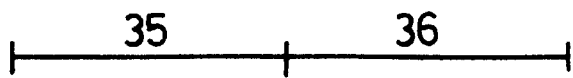
Figure 3A:
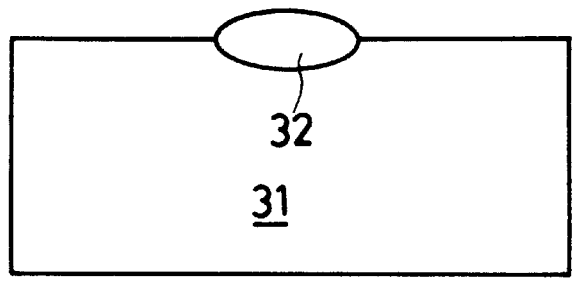

In the method of fabricating the semiconductor device having a dual-gate according to the present invention, as illustrated in FIG. 3A, a field oxide film 32 is formed on the silicon substrate 31 using the LOCOS technique. A first portion 35 on the left side of the field oxide film 32 is for forming an NMOS transistor, while a second portion 36 on the right side of the field oxide film 32 is for forming a PMOS transistor.

Figure 3B:
Figure 3B:
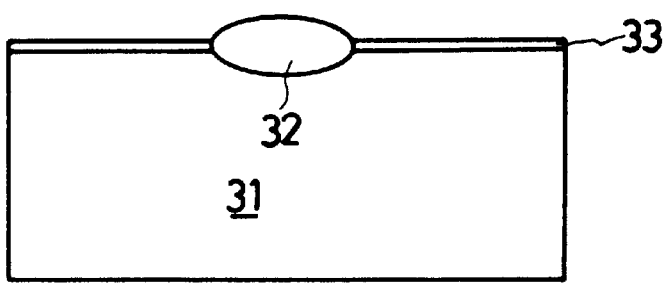

Then, as illustrated in FIG. 3B, a gate insulating film 33 is formed on the first and second portions 35 and 36 using a thermal oxidation technique or the like.

Figure 3C:
Figure 3C:
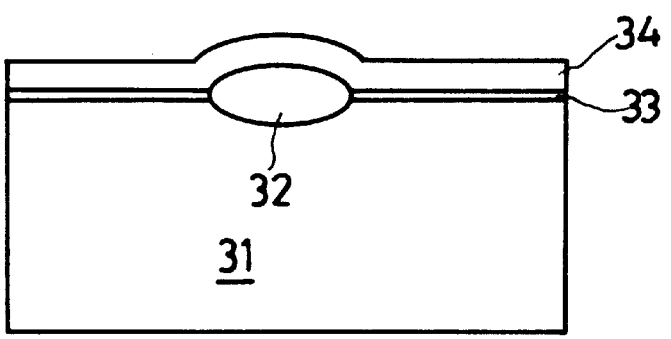

Thereafter, as illustrated in FIG. 3C, a polysilicon layer 34 is formed on the field oxide film 32 and the gate insulating film 33. The polysilicon layer 34 is blanket deposited using a chemical vapor deposition technique. The polysilicon layer 34 is composed of undoped polysilicon.

Figure 3D:
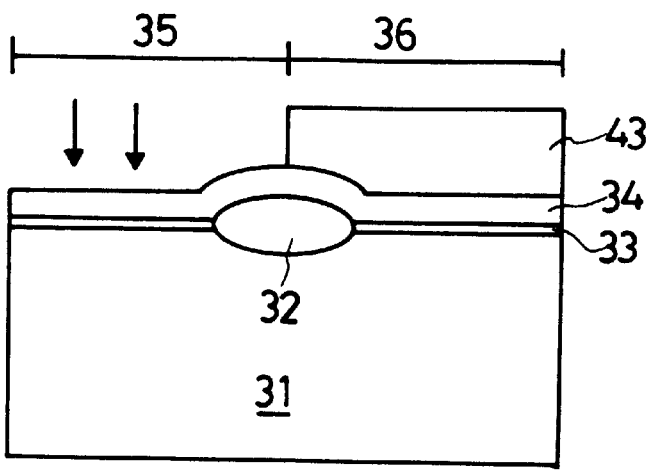

Then, as illustrated in FIG. 3D, a mask 43 of photoresist is formed on the second portion 36, and a dopant for forming an NMOS transistor gate is selectively implanted. That is, an N-type dopant and, more advantageously, $P^+$ (Phosphorous) is implanted in the polysilicon layer covering the first portion 35. After implanting the dopant, the mask 43 is removed.

Figure 3E:
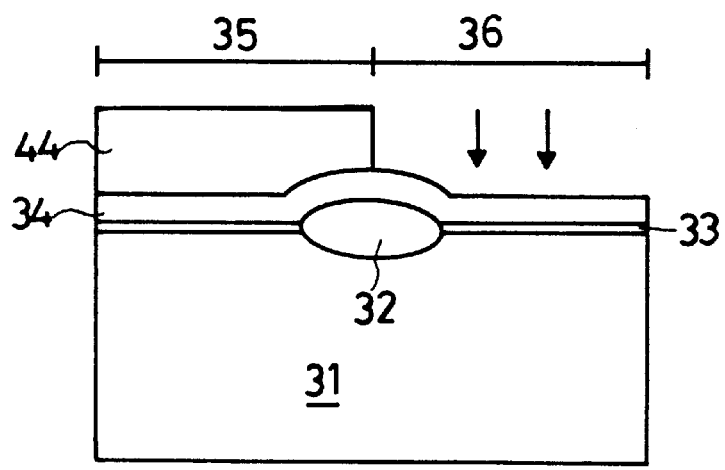

Then, as illustrated in FIG. 3E, a mask 44 of photoresist is formed on the first portion 35, and a dopant for forming the PMOS transistor gate is selectively implanted. That is, a P-type dopant, more advantageously, $B^+$ (Boron) is implanted in the polysilicon layer covering the second portion 36.

Figure 3F:
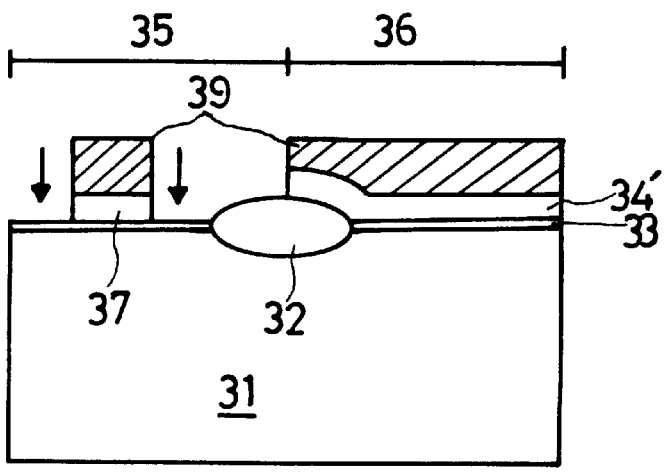

Then, as illustrated in FIG. 3F, the mask 44 is removed following the dopant implantation. Subsequently, a first mask pattern 39 of photoresist is formed on second portion 36. Then, a first gate 37 (an NMOS transistor gate) is formed through etching. In succession, a first conducting dopant for forming the source/drain LDD regions, more advantageously, $As^+$ (Arsenic) is implanted on both sides of the NMOS transistor gate 37 using the first mask pattern 39 as a mask. Reference numeral 34' indicates the residual portion of the polysilicon layer after forming the first gate 37.

Figure 3G:
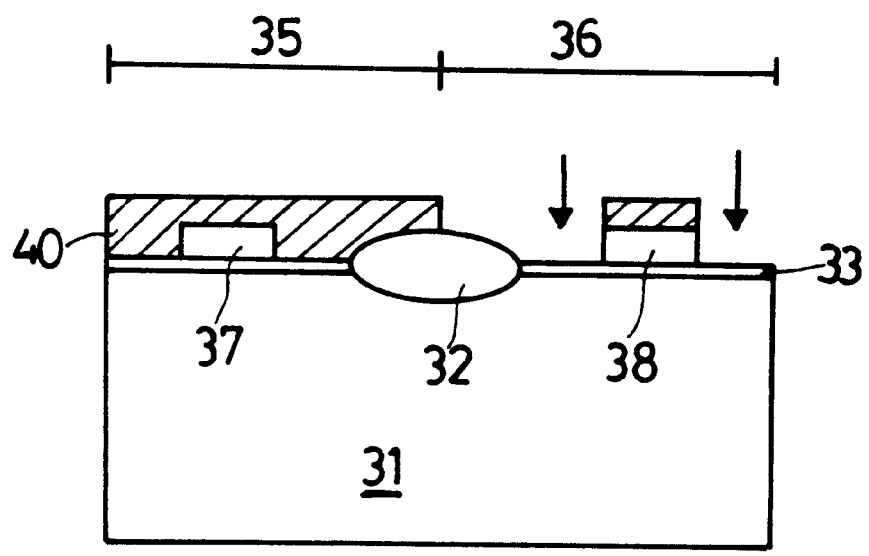

Then, as illustrated in FIG. 3G, the first mask pattern 39 is removed. Subsequently, a second mask pattern 40 of photoresist is formed on the first portion 35. Then, a second gate 38 (a PMOS transistor gate) is formed through etching the polysilicon layer 34. Subsequently, a second conducting dopant for forming the source/drain LDD regions, more advantageously, $BF_2^+$ is implanted on both sides of the PMOS transistor gate 38 using the second mask pattern 40 as a mask.

Figure 3H:
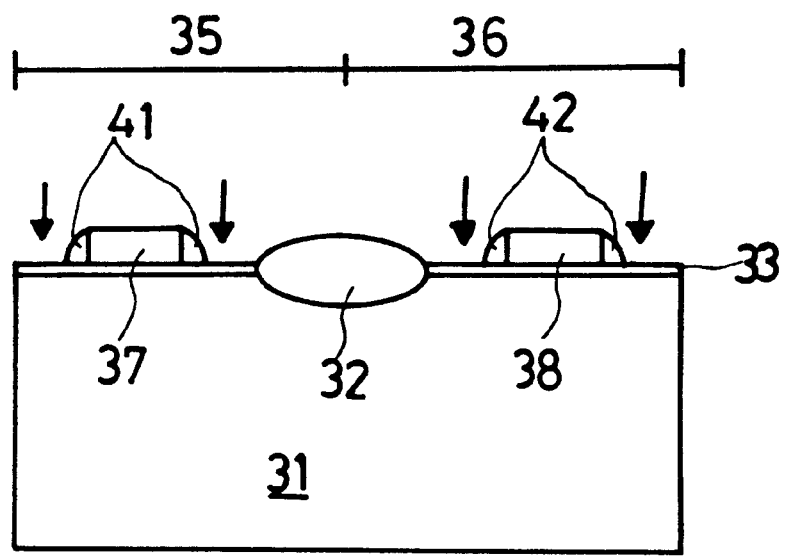

Then, as illustrated in FIG. 3H, the second mask pattern 40 is removed. Subsequently, side wall spacers 41 and 42 of oxide film are formed on both sides of the first and second gates 37 and 38, and high-concentration dopants are implanted to form the source/drain regions. That is, $As^+$ (Arsenic) is implanted in the first portion 35 for forming the NMOS transistor while $BF_2^+$ is implanted in the second portion 36 for forming the PMOS transistor.

Through the previously-described steps, the semiconductor device having a dual-gate is fabricated.

As described above, in the inventive semiconductor device fabrication method, the NMOS and PMOS transistor gates are formed through etching. Thus, reliability in the gate etching step, which is a most important step in the dual-gate semiconductor device fabrication process, can be enhanced. In the meantime, a photo-mask formation process and an etching process is separately required to etch the NMOS and PMOS transistor gates, respectively. But, the photo-mask used in forming the gates can be used again in the subsequent dopant implantation steps for forming the LDD regions. Thus, the number of processing steps is not substantially increased. Therefore, a stable process can be realized. Furthermore, production yield can be enhanced.

It will be apparent to those skilled in the art that various modifications and variations can be made in the semiconductor device fabrication method of the present invention without departing from the spirit or scope of the invention. Thus, it is intended that the present invention cover the modifications and variations of this invention provided they come within the scope of the appended claims and their equivalents.

What is claimed is:

1. A method of fabricating a semiconductor device having a dual-gate, comprising the steps of:

providing a semiconductor substrate with a gate insulating film formed on a first portion and a second portion of the semiconductor substrate and a polysilicon layer formed on the gate insulating film, a first dopant of a first conductive type being implanted in the polysilicon layer covering the first portion and a second dopant of a second conductive type being implanted in the polysilicon layer covering the second portion;

first selectively etching the polysilicon layer covering the first portion using a first mask to form a first gate;

first selectively implanting a third dopant of the first conductive type using the first mask, to form first impurity regions on both sides of the first gate;

second selectively etching the polysilicon layer covering the second portion using a second mask to form a second gate; and second selectively implanting a fourth dopant of the second conductive type using the second mask, to form second impurity regions on both sides of the second gate.

2. The method of claim 1, wherein the providing step comprises the substeps of:

first forming the gate insulating film on at least the first and second portions of the semiconductor substrate;

second forming the polysilicon layer on the gate insulating film;

third selectively implanting the first dopant in the polysilicon layer covering the first portion; and fourth selectively implanting the second dopant in the polysilicon layer covering the second portion.

3. The method of claim 2, wherein the third selectively implanting step implants phosphorous as the first dopant.

4. The method of claim 2, wherein the fourth selectively implanting step implants boron as the second dopant.

5. The method of claim 1, wherein the first selectively etching step comprises the substeps of:

forming the first mask over the semiconductor substrate, the first mask selectively exposing portions of the polysilicon layer covering the first portion; and etching the exposed portions of the polysilicon layer.

6. The method of claim 1, wherein the second selectively etching step comprises the substeps of:

forming the second mask over the semiconductor substrate, the second mask selectively exposing portions of the polysilicon layer covering the second portion; and etching the exposed portions of the polysilicon layer.

7. The method of claim 1, wherein the first selectively implanting step implants arsenic as the third dopant.

8. The method of claim 1, wherein the second selectively implanting step implants $BF_2^+$ as the fourth dopant.

9. A method of fabricating a semiconductor device having a dual-gate, comprising the steps of:

forming a gate insulating film on at least first and second portions of a semiconductor substrate;

forming a polysilicon layer on the gate insulating film;

selectively implanting phosphorous ions in the polysilicon layer covering the first portion;

selectively implanting boron ions in the polysilicon layer covering the second portion;

forming a first mask over the semiconductor substrate, the first mask selectively exposing first portions of the polysilicon layer covering the first portion of the semiconductor substrate;

etching the exposed first portions of the polysilicon layer to expose third portions of the semiconductor substrate;

implanting arsenic ions in the exposed third portions of the semiconductor substrate, using the first mask;

forming a second mask over the semiconductor substrate, the second mask selectively exposing second portions of the polysilicon layer covering the second portion of the semiconductor substrate;

etching the exposed second portions of the polysilicon layer to expose fourth portions of the semiconductor substrate; and implanting $BF_2$ ions in the exposed fourth portions of the semiconductor substrate, using the second mask.

10. A method of fabricating a semiconductor device having a dual-gate on a semiconductor substrate including a gate insulating film formed on first and second portions of the semiconductor substrate and a polysilicon layer formed on the gate insulating film, the method of fabricating comprising the steps of:

a) selectively etching the polysilicon layer on the first portion using a first mask, to form a first gate;

b) selectively implanting a first dopant of a first conductive type using the first mask, to form first impurity regions on both sides of the first gate;

c) selectively etching the polysilicon layer on the second portion using a second mask, to form a second gate; and d) selectively implanting a second dopant of a second conductive type using the second mask, to form second impurity regions on both sides of the second gate.

11. The method of fabricating of claim 10, wherein said step b) comprises selectively implanting arsenic ions as the first dopant.

12. The method of fabricating of claim 10, wherein said step d) comprises selectively implanting $BF_2$ ions as the second dopant.

13. The method of fabricating of claim 10, wherein a third dopant of the first conductive type is implanted into the polysilicon layer on the first portion of the semiconductor substrate and a fourth dopant of the second conductive type is implanted into the polysilicon layer on the second portion of the semiconductor substrate.

14. The method of fabricating of claim 13, wherein the third dopant is phosphorous ions and the fourth dopant is boron ions.

* * * * *